United States Patent
Ichino et al.

(10) Patent No.: US 11,992,957 B2
(45) Date of Patent: May 28, 2024

(54) MOUNTING-RELATED DEVICE AND RAIL DEVICE

(71) Applicant: FUJI CORPORATION, Chiryu (JP)

(72) Inventors: Shinji Ichino, Nagoya (JP); Tsuyoshi Hamane, Toyota (JP)

(73) Assignee: FUJI CORPORATION, Chiryu (JP)

( * ) Notice: Subject to any disclaimer, the term of this patent is extended or adjusted under 35 U.S.C. 154(b) by 356 days.

(21) Appl. No.: 17/424,017

(22) PCT Filed: Feb. 5, 2019

(86) PCT No.: PCT/JP2019/004020
§ 371 (c)(1),
(2) Date: Jul. 19, 2021

(87) PCT Pub. No.: WO2020/161794
PCT Pub. Date: Aug. 13, 2020

(65) Prior Publication Data
US 2022/0080595 A1 Mar. 17, 2022

(51) Int. Cl.
| *B25J 9/16* | (2006.01) |
| *G05B 19/418* | (2006.01) |
| *H05K 13/00* | (2006.01) |
| *H05K 13/04* | (2006.01) |

(52) U.S. Cl.
CPC .......... *B25J 9/1682* (2013.01); *B25J 9/1687* (2013.01); *G05B 19/4189* (2013.01); *H05K 13/0061* (2013.01); *H05K 13/04* (2013.01); *G05B 2219/39001* (2013.01); *G05B 2219/40252* (2013.01)

(58) Field of Classification Search
CPC ... B25J 9/1682; B25J 9/1687; G05B 19/4189; G05B 2219/39001; G05B 2219/40252; H05K 13/0061; H05K 13/04; B65G 21/00
See application file for complete search history.

(56) References Cited

U.S. PATENT DOCUMENTS

| 2005/0227429 A1* | 10/2005 | Minamitani | ............ H01L 24/81 438/222 |
| 2005/0254914 A1* | 11/2005 | Kato | .................... B23Q 1/0063 409/221 |

FOREIGN PATENT DOCUMENTS

| JP | 2003-048613 A | 2/2003 |
| JP | 2016-207867 A | 12/2016 |
| WO | WO 2018/163324 A1 | 9/2018 |

OTHER PUBLICATIONS

International Search Report dated Apr. 16, 2019 in PCT/JP2019/004020 filed on Feb. 5, 2019 (1 page).

* cited by examiner

Primary Examiner — Charles R Kasenge
(74) Attorney, Agent, or Firm — Oblon, McClelland, Maier & Neustadt, L.L.P.

(57) ABSTRACT

A mounting-related device includes an articulated robot that is disposed in a movable space formed between a first conveyance section and a second conveyance section, holds, and moves a processing target object such that a posture of a mounting surface can be changed, and the first conveyance section and the second conveyance section include a rail attachment section that can attach and detach a pair of rail devices bridged between the first conveyance section and the second conveyance section for moving a board when conveying the board.

8 Claims, 9 Drawing Sheets

MOUNTING-RELATED DEVICE AND RAIL DEVICE

TECHNICAL FIELD

In the present specification, a mounting-related device and a rail device are disclosed.

BACKGROUND ART

Conventionally, as a mounting device for mounting components, for example, a mounting device has been proposed in which a three-dimensional substrate is disposed on a pallet, the pallet is moved by an articulated robot, and the components are arranged on a three-dimensional mounting surface (for example, refer to Patent Literature 1). In the device, a special three-dimensional substrate can be conveyed in a general-purpose manner.

PATENT LITERATURE

Patent Literature 1: Pamphlet of international Publication No. WO2018/163324

BRIEF SUMMARY OF THE INVENTION

Technical Problem

However, in the device of Patent Literature 1, when a board, which is a general plate-like member, is to be conveyed, it has to be conveyed by an articulated robot since conveyance paths on an introduction side and a discharge side are not connected, and it is not practical to use the device, for example, since a dedicated pallet is required and a conveying operation is complicated.

The present disclosure has been made in view of such a problem, and the main object of the present disclosure is to provide a mounting-related device and a rail device that can convey various processing target objects in a more suitable state.

Solution to Problem

The present disclosure has taken the following means to achieve the main object described above.

A conveyance device described in the present specification is a conveyance device that performs a predetermined process on a processing target object by using an XY-robot including a processing head for performing a predetermined process on the processing target object having a mounting surface and a moving section for moving the processing head in a predetermined plane direction, the mounting-related device including a first conveyance section configured to convey the processing target object into an introduction position, a second conveyance section configured to convey the processing target object out of a discharge position, an articulated robot disposed below a moving region of the processing head and in a movable space formed between the first conveyance section and the second conveyance section, and configured to hold the processing target object such that a posture of the mounting surface can be changed, and move the processing target object between the introduction position and the discharge position, and a control section configured to control the XY-robot and the articulated robot, in which the first conveyance section and the second conveyance section include a rail attachment section that can attach and detach a pair of rail devices which are bridged between the first conveyance section and the second conveyance section and move a board as the processing target object which can be conveyed by the first conveyance section and the second conveyance section when the board is conveyed.

In the mounting-related device, since the processing target object can be moved and fixed by the articulated robot while changing the posture of the mounting surface, it is possible to execute a three-dimensional process. On the other hand, in the mounting-related device, the board, which is a plate-like member, can be conveyed by attaching the rail device between the first conveyance section and the second conveyance section. Accordingly, in mounting-related device, various processing target objects can be conveyed in a more suitable state. Here, the "mounting-related device" may perform, for example, any one or more of a process for applying a viscous liquid to a processing target object, a process for arranging a member on a processing target object, a process for inspecting a processing target object and/or a member arranged on a processing target object, as a predetermined process. At this time, the mounting-related device may include an XY-robot including a processing head for performing any one or more of the application process of the viscous liquid, the arrangement process of the member, and the inspection process on the processing target object having the mounting surface, and a moving section for moving the processing head in a predetermined plane direction.

DESCRIPTION OF EMBODIMENTS

Figure 1:
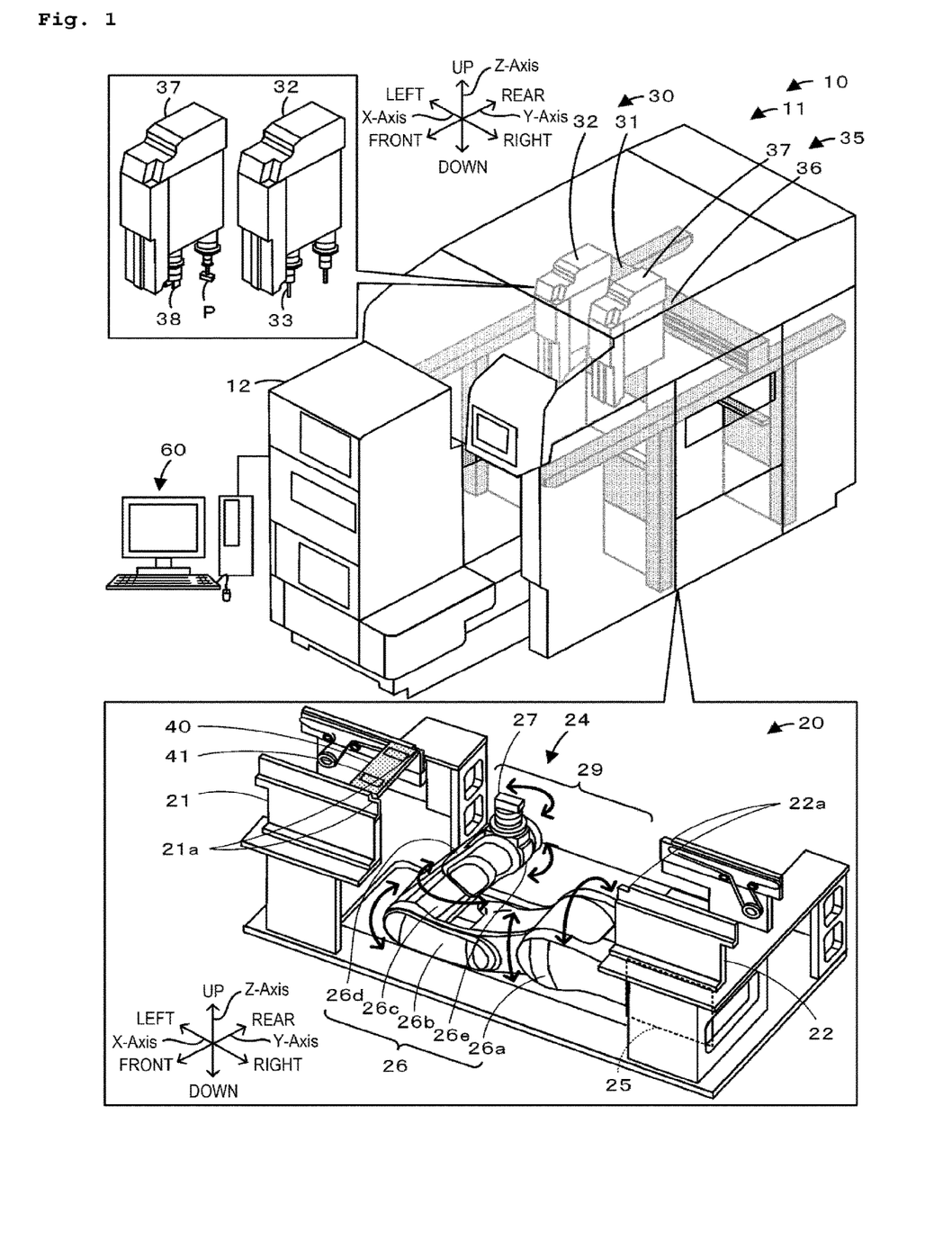
FIG. 1 is a schematic explanatory diagram of mounting system 10.
Figure 2:
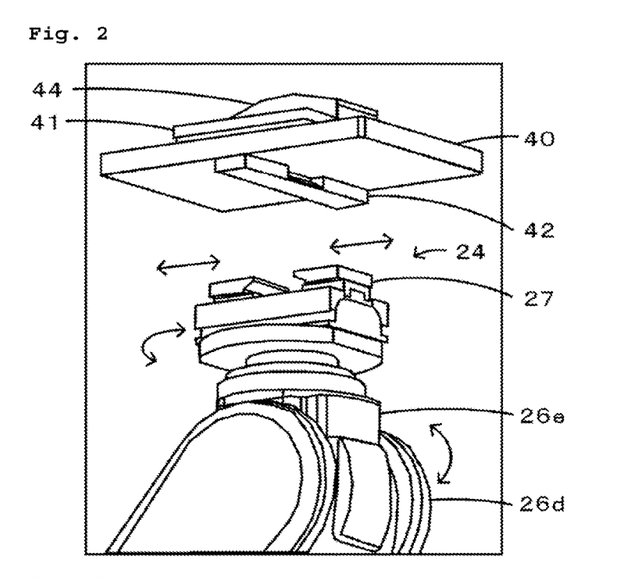
FIG. 2 is an explanatory diagram showing an example of a configuration of general-purpose attachment section 27 and conveyance pallet 40.
Figure 3:
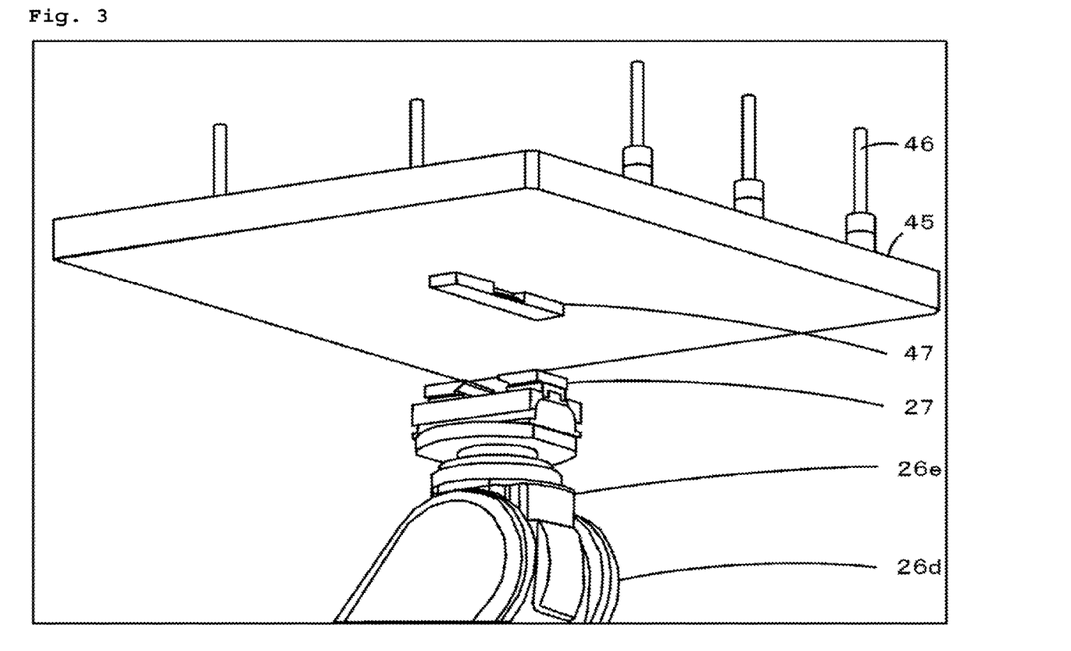
FIG. 3 is an explanatory diagram showing an example of a configuration of general-purpose attachment section 27 and supporting plate 45.
Figure 4:
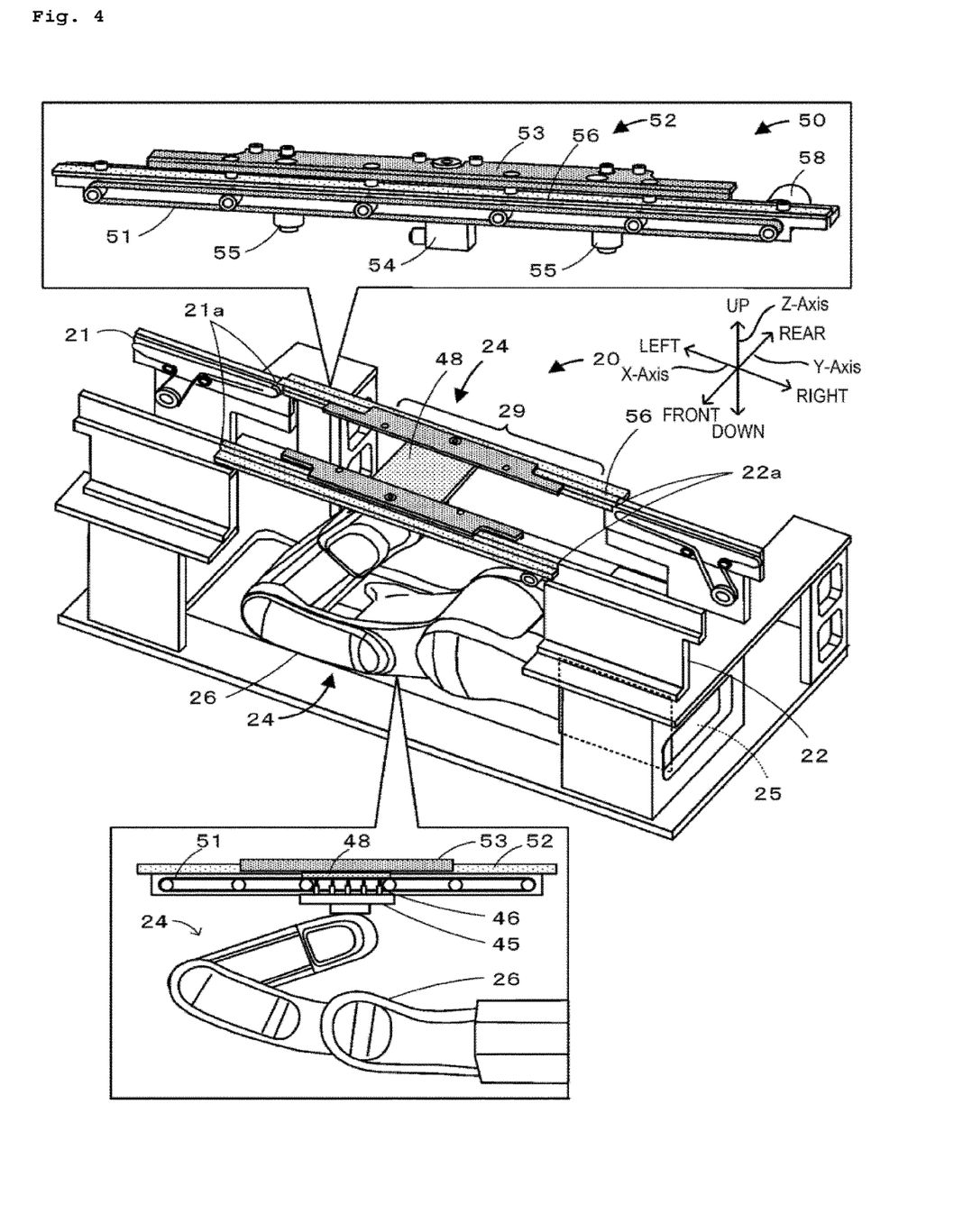
FIG. 4 is an explanatory diagram showing an example of a configuration of rail device 50.
Figures 5, 5A:
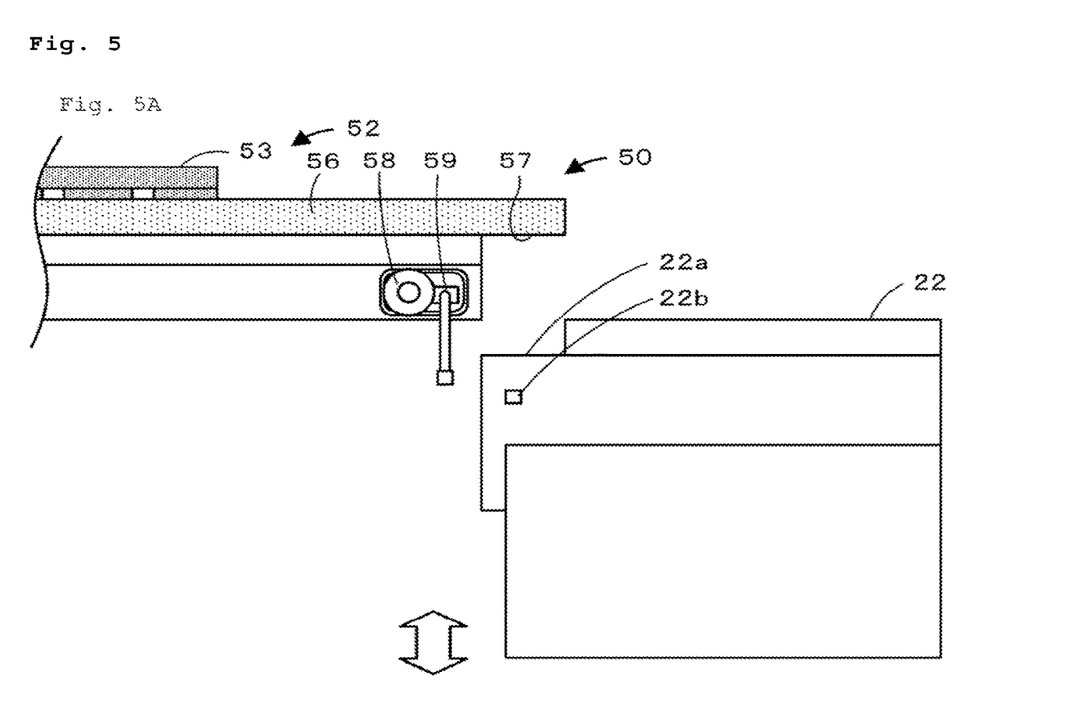
FIG. 5 is explanatory diagrams showing an example of attaching and detaching of rail device 50.
Figure 5B:
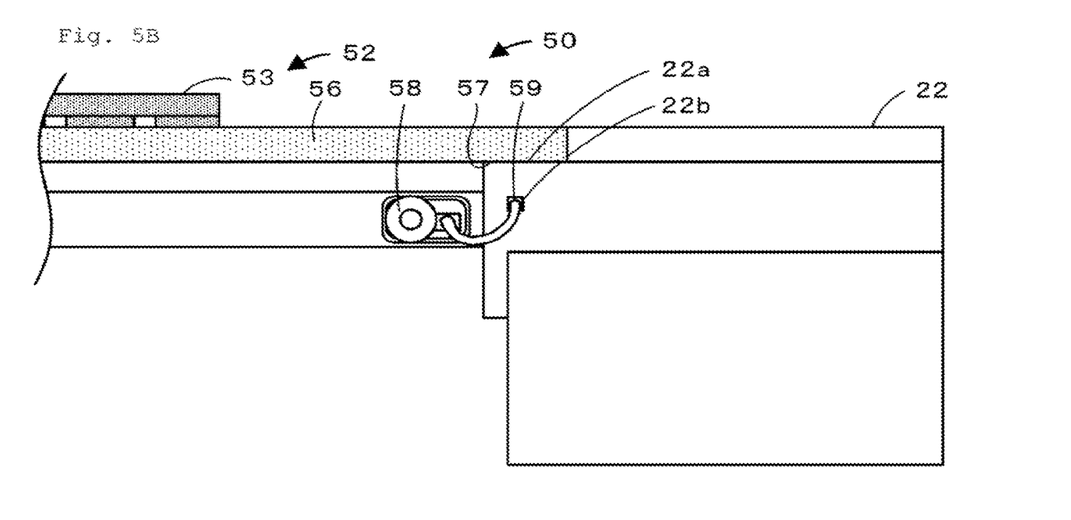
Figure 6:
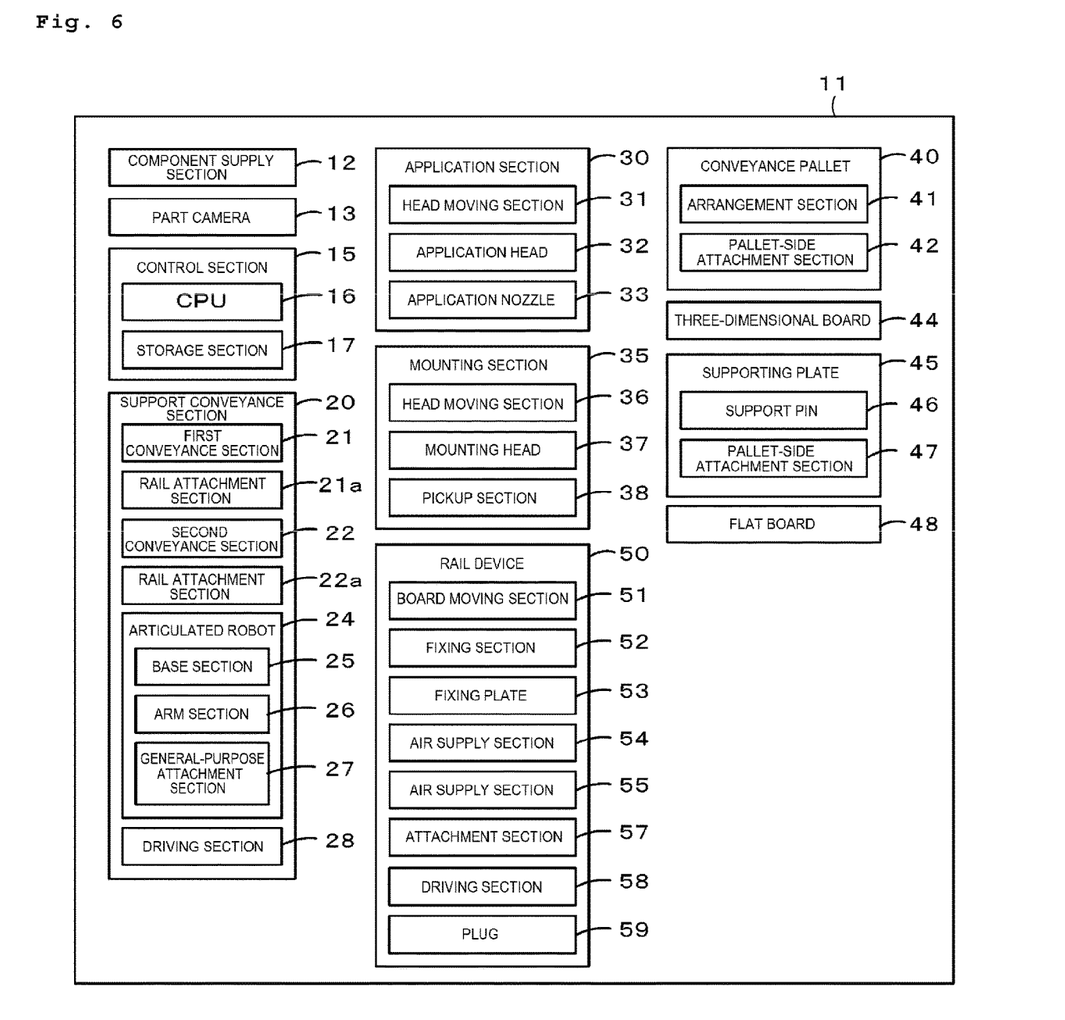
FIG. 6 is a block diagram schematically showing a configuration of mounting device 11.

The present embodiment will be described below with reference to the drawings. FIG. 1 is a schematic explanatory diagram of mounting system 10 that is an example of the present disclosure. FIG. 2 is an explanatory diagram showing an example of a configuration of general-purpose attachment section 27 and conveyance pallet 40 of articulated robot 24. FIG. 3 is an explanatory diagram showing an example of a configuration of general-purpose attachment section 27 and supporting plate 45. FIG. 4 is an explanatory diagram showing an example of a configuration of rail device 50. FIG. 5 is explanatory diagrams showing an example of attaching and detaching of rail device 50, in which FIG. 5A shows a detaching state and FIG. 5B shows an attaching state. FIG. 6 is a block diagram schematically showing a configuration of mounting device 11.

As shown in FIG. 1, mounting system 10 includes mounting device 11, a reflow device (not shown), and management computer (PC) 60. Mounting device 11 is a device for applying a viscous liquid to three-dimensional board 44 (refer to FIGS. 2 and 7) as a three-dimensional processing target object, flat board 48 (refer to FIG. 4), or the like, and arranging members such as component P. The viscous fluid includes a solder paste, a conductive paste, an adhesive, grease, and the like. In addition, three-dimensional board 44 and flat board 48 are collectively referred to as a "board". Further, applying the viscous fluid (also called a printing process), and picking up and arranging of components (also called a mounting process) are collectively called a mounting-related process. The reflow device is a device for performing a reflow process of heating a three-dimensional board on which the components are arranged on the viscous fluid. Management PC 60 is a device for managing the production of three-dimensional board 44 and flat board 48. Management PC 60 stores mounting condition information. The mounting condition information defines which components are to be mounted on the board in which order, the number of components required to be produced, and the like. The mounting condition information includes two-dimensional or three-dimensional data such as an application position of the viscous fluid to be processed by mounting device 11 and an arrangement position of components. In the present embodiment, a left-right direction (X-axis), a front-rear direction (Y-axis), and an up-down direction (Z-axis) are as shown in FIG. 1.

Mounting device 11 is a device for performing the process for applying the viscous fluid and the process for mounting component P on three-dimensional board 44 having a three-dimensional mounting surface, flat board 48 which is a plate-like member or the like. Mounting device 11 includes component supply section 12, parts camera 13, control section 15, support conveyance section 20, application section 30, mounting section 35, and the like. Mounting device 11 conveys three-dimensional board 44 by articulated robot 24 when executing the mounting-related process on three-dimensional board 44 (refer to FIG. 7). On the other hand, in mounting device 11, when executing the mounting-related process on flat board 48, rail device 50 conveys flat board 48 in a state in which rail device 50 is bridged between first conveyance section 21 and second conveyance section 22, as shown in FIG. 4. In addition, when executing the mounting-related process on flat board 48, flat board 48 is supported from below by articulated robot 24 to which supporting plate 45 is attached.

Component supply section 12 is a unit for supplying component P to mounting section 35. Component supply section 12 includes, for example, a feeder on which a tape holding component P is attached, a tray on which component P is placed in an array, and the like. Parts camera 13 captures an image of one or more components P picked up by mounting head 37 of mounting section 35 from below. An upper portion of parts camera 13 is an imaging range.

Control section 15 is configured as a microprocessor centered on CPU 16, and includes storage section 17 or the like for storing various data. Control section 15 exchanges information with component supply section 12, parts camera 13, support conveyance section 20, application section 30, mounting section 35, and the like. In mounting device 11, control section 15 executes the application process of applying the viscous fluid to a surface on which the three-dimensional board is formed by application section 30, and the mounting process of arranging component P on a surface on which the three-dimensional board is formed by mounting section 35.

Support conveyance section 20 is a unit that can convey three-dimensional board 44, and adjust and fix an inclination angle of three-dimensional board 44. As shown in FIG. 1, support conveyance section 20 includes first conveyance section 21, second conveyance section 22, articulated robot 24, and driving section 28. First conveyance section 21 is a conveyor that conveys conveyance pallet 40 on which three-dimensional board 44 is arranged from a device inlet into an introduction position. First conveyance section 21 has a pair of conveyor belts which are provided at intervals in the front-rear direction in FIG. 1 and bridged in the left-right direction. Conveyance pallet 40 is conveyed by the conveyor belt. Second conveyance section 22 is a conveyor that conveys conveyance pallet 40 holding three-dimensional board 44 out of a discharge position to a device outlet. Second conveyance section 22 has a configuration similar to that of first conveyance section 21. In support conveyance section 20, movable space 29 in which articulated robot 24 is disposed and operated is formed below a moving region of application head 32 and mounting head 37 and between first conveyance section 21 and second conveyance section 22.

As shown in FIGS. 1 and 2, conveyance pallet 40 includes arrangement section 41 for fixing the three-dimensional board and pallet-side attachment section 42 held by arm section 26. Arrangement section 41 may be any member as long as it fixes the three-dimensional board, and may be, for example, a clamp mechanism that clamps three-dimensional board 44 by spring force, or may be a mechanism that screws the three-dimensional board. As shown in FIG. 2, pallet-side attachment section 42 may be a clamp plate detachably fixed to conveyance pallet 40. The clamp plate is formed with a groove or a recessed portion to be gripped by general-purpose attachment section 27.

Articulated robot 24 is a unit that can move and fix three-dimensional board 44. Articulated robot 24 is configured to grip conveyance pallet 40 to which three-dimensional board 44 is fixed, and to move conveyance pallet 40 to the introduction position, the processing position, and the discharge position. Articulated robot 24 has multiple tilt axes, can tilt three-dimensional board 44 in multiple directions, and holds a posture of three-dimensional board 44 with respect to application head 32 and mounting head 37 so as to be changeable. The greater the number of tilt axes, the easier the posture of three-dimensional board 44 can be changed, and the number of tilt axes is preferably four or more. In articulated robot 24, the tilt axis has six axes. Articulated robot 24 has base section 25, arm section 26, and general-purpose attachment section 27. Base section 25 is fixed to a device housing in a state in which arm section 26 is supported. Articulated robot 24 is a perpendicular articulated robot, and an axial direction of base section 25 is fixed in a direction along a horizontal direction, for example, in a direction (X-axis) along a movement direction of three-dimensional board 44. That is, support conveyance section 20 includes the perpendicular articulated robot placed horizontally. By disposing articulated robot 24 in this manner, it is possible to tilt three-dimensional board 44 in limited movable space 29, or to lower three-dimensional board 44 to a position lower than a conveyance height of first conveyance section 21 and second conveyance section 22.

Arm section 26 has first arm 26a, second arm 26b, third arm 26c, fourth arm 26d, and fifth arm 26e. First arm 26a is disposed on base section 25 so as to be axially rotatable about the X-axis. Second arm 26b is pivotally supported by first arm 26a so as to be swingable mainly in the up-down direction. Third arm 26c is pivotally supported by second arm 26b so as to be swingable mainly in the left-right direction. Fourth arm 26d is disposed on third arm 26c so as to be axially rotatable about the main spindle of third arm 26c. Fifth arm 26e is pivotally supported by fourth arm 26d so as to be swingable mainly in the left-right direction. Fifth arm 26e is disposed with general-purpose attachment section 27 so as to be axially rotatable about the main spindle thereof. General-purpose attachment section 27 is a mechanical chuck disposed at a distal end of arm section 26 to grip and fix pallet-side attachment section 42 (clamp plate). General-purpose attachment section 27 performs an opening and closing operation by pressure supplied from the main body. As shown in FIG. 2, when executing a mounting-related process on three-dimensional board 44, general-purpose attachment section 27 grip pallet-side attachment section 42 to attach conveyance pallet 40. In addition, as shown in FIG. 3, when executing the mounting-related process on flat board 48, general-purpose attachment section 27 grips plate-side attachment section 47 (the clamp plate) to attach supporting plate 45. Support pin 46 serving as a support member is arranged on supporting plate 45 below a region where component P or the like is not mounted on flat board 48. Support pin 46 is fixed to supporting plate 45 by, for example, magnetic force or the like. Driving section 28 (refer to FIG. 6) includes, for example, a motor for driving the conveyor belt of first conveyance section 21 and second conveyance section 22, a motor for axially rotating or swinging each member of arm section 26, and the like. Articulated robot 24 conveys three-dimensional board 44 between the introduction position, the processing position, and the discharge position in a state where conveyance pallet 40 is attached. At this time, articulated robot 24 attaches pallet-side attachment section 42 of conveyance pallet 40 at first conveyance section 21 to move conveyance pallet 40, and detach pallet-side attachment section 42 at second conveyance section 22.

Application section 30 is an application unit that applies the viscous fluid to three-dimensional board fixed to support conveyance section 20. Application section 30 includes head moving section 31, an application head 32, and application nozzle 33. Head moving section 31 includes a slider that is moved by being guided by guide rails in XY-directions, and a motor that drives the slider. Application section 30 is configured as an XY-robot that moves application head 32 serving as a processing head in the XY-plane direction. Application nozzle 33 is detachably attached to a lower surface side of application head 32. Application nozzle 33 is a nozzle that applies pressure to an accommodation section accommodating the viscous fluid to supply a predetermined amount of the viscous fluid from a distal end of application nozzle 33.

Mounting section 35 is a mounting unit that picks up component P from component supply section 12 and arranges component P on a three-dimensional board fixed to support conveyance section 20. Mounting section 35 includes head moving section 36, mounting head 37, and pickup section 38. Head moving section 36 includes a slider that is moved by being guided by guide rails in XY-directions, and a motor that drives the slider. Mounting section 35 is configured as an XY-robot that moves mounting head 37 serving as a processing head in the XY-plane direction. Pickup section 38 is a member detachably attached on the lower surface side of mounting head 37 to pick up component P. Pickup section 38 may be a suction nozzle that picks up component P using a negative pressure, or may be a mechanical chuck that mechanically grips component P. Mounting head 37 is configured to be attachable with one or more pickup sections 38. Head moving section 36 may share a part of the slider with head moving section 31. In addition, application head 32 and mounting head 37 may have a similar structure, or may freely attach application nozzle 33 and pickup section 38 serving as a tool.

Rail device 50 is a conveyance unit used when executing the mounting-related process on flat board 48. Rail device 50 includes board moving section 51, fixing section 52, attachment section 57, and driving section 58. Board moving section 51 supports and moves flat board 48, and is a belt conveyor including multiple rollers and a belt bridged over the rollers. Fixing section 52 includes grip and fix flat board 48, and includes fixing plate 53, air supply sections 54 and 55, and structure 56. Fixing plate 53 is disposed so as to be movable up and down in structure 56 bridged between first conveyance section 21 and second conveyance section 22. Fixing section 52 has an air cylinder (not shown), and fixing plate 53 moves up and down depending on whether air is supplied from air supply section 54 or air is supplied from the air supply section 55. Fixing plate 53 is usually arranged above and is pushed down when flat board 48 is fixed. An edge portion protruding inside and downward board moving section 51 is formed on fixing section 52, and flat board 48 is fixed by pressing the upper surface of flat board 48 with the edge portion. Attachment section 57 is connected to rail attachment section 21a formed on first conveyance section 21 and rail attachment section 22a formed on second conveyance section 22. Attachment section 57 is a portion having unevenness formed on both ends of structure 56, and is formed in a shape configured to be fitted into the unevenness of rail attachment sections 21a and 22a. Attachment section 57 may have, for example, a lock mechanism or the like in which a protrusion is inserted into a hole portion to regulate the movement of rail device 50 in the up-down direction. Driving section 58 is a motor that applies a conveyance force for conveying flat board 48 by rotationally driving board moving section 51. Plug 59 is electrically connected to driving section 58. As shown in FIG. 5, rail device 50 is fixed by fitting attachment section 57 to rail attachment section 22a and fitting attachment section 57 to rail attachment section 21a (not shown). Before starting the production of flat board 48, an operator bridges a pair of rail devices 50 between first conveyance section 21 and second conveyance section 22, and inserts plug 59 into socket 22b disposed in second conveyance section 22 to enable driving section 58 to be driven and controlled (refer to FIG. 5B).

Figure 7:
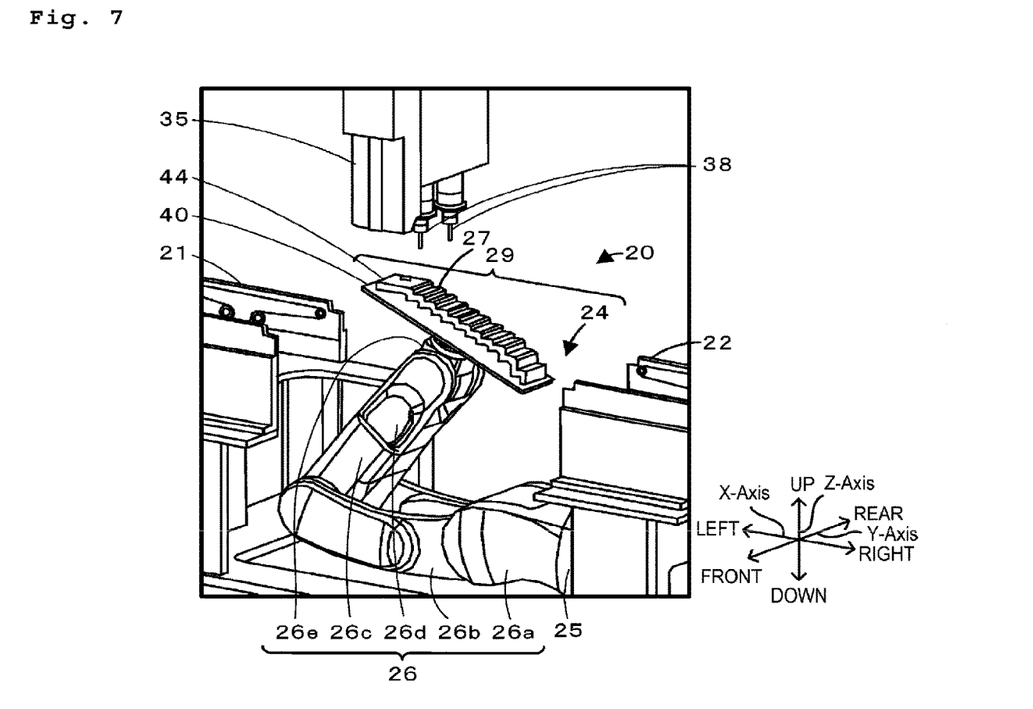
FIG. 7 is an explanatory diagram of support conveyance section 20 for fixing conveyance pallet 40 at a processing position.
Figure 8:
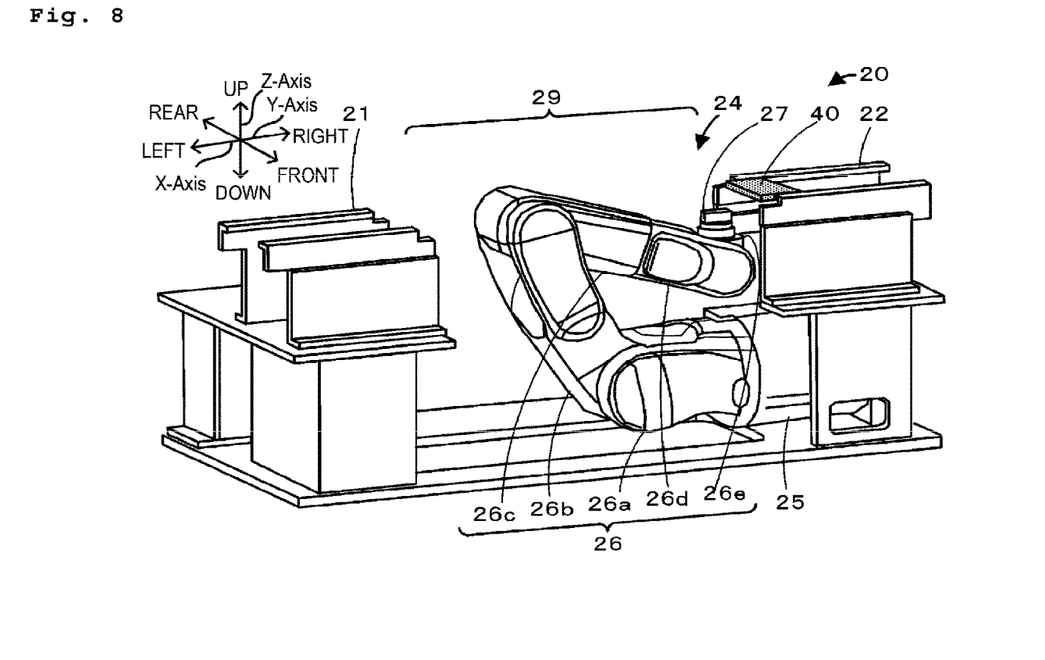
FIG. 8 is an explanatory diagram of support conveyance section 20 for detaching conveyance pallet 40 at a discharge position.

Next, operations of mounting system 10 according to the present embodiment configured as described above, first, the application process and the mounting process executed by mounting device 11 with respect to three-dimensional board 44 will be described. When the processes are started, CPU 16 of control section 15 first acquires the mounting condition information including three-dimensional data of three-dimensional board 44, which is a processing target object, from management PC 60, causes first conveyance section 21 to convey conveyance pallet 40 to which the three-dimensional board is fixed, causes conveyance pallet 40 to be attached on general-purpose attachment section 27, and moves conveyance pallet 40 to the processing position. FIG. 7 is an explanatory diagram of support conveyance section 20 for fixing conveyance pallet 40 at a processing position. FIG. 8 is an explanatory diagram of support conveyance section 20 for detaching conveyance pallet 40 at a discharge position. CPU 16 controls first conveyance section 21 so as to move conveyance pallet 40 to the introduction position (refer to FIG. 1), and controls articulated robot 24 such that general-purpose attachment section 27 grips pallet-side attachment section 42 below conveyance pallet 40. Next, CPU 16 controls articulated robot 24 so as to move conveyance pallet 40 to the processing position that is a center of movable space 29 (refer to FIG. 7). Subsequently, CPU 16 controls application section 30 and mounting section 35 so as to apply the viscous fluid to the mounting surface of three-dimensional board 44 and execute a process for arranging component P. When the printing process and the mounting process are executed, CPU 16 moves conveyance pallet 40 to the discharge position to detach general-purpose attachment section 27 (refer to FIG. 8). Then, CPU 16 causes second conveyance section 22 to convey out of conveyance pallet 40. CPU 16 causes such a process to be repeatedly executed until the production of three-dimensional board 44 is completed.

Next, the application process and the mounting process executed by mounting device 11 with respect to flat board 48 will be described. Prior to the start of the mounting-related process, the operator performs an operation of bridging a pair of rail devices 50 between first conveyance section 21 and second conveyance section 22, as described above, and further performs an operation of attaching supporting plate 45 to general-purpose attachment section 27. After the operation, the operator inputs the start of the mounting-related process on flat board 48. When the process is started, CPU 16 of control section 15 first acquires the mounting condition information of flat board 48, which is a processing target object, from management PC 60, causes first conveyance section 21 to convey flat board 48, further causes board moving section 51 of rail device 50 to move flat board 48 to the processing position of the center, and causes fixing section 52 to fix flat board 48. Next, CPU 16 controls articulated robot 24 to move supporting plate 45 below flat board 48, so that flat board 48 is supported by supporting plate 45 (refer to FIG. 4). Subsequently, CPU 16 controls application section 30 and mounting section 35 so as to apply the viscous fluid to the mounting surface of flat board 48 and execute the process for arranging component P. When the printing process and the mounting process are executed, CPU 16 causes board moving section 51 to move flat board 48 to the discharge position, and causes second conveyance section 22 to convey flat board 48 out of the device. CPU 16 causes such a process to be repeatedly executed until the production of flat board 48 is completed. As described above, in mounting device 11, it is possible that the mounting-related process is executed on three-dimensional board 44 by the conveyance of articulated robot 24, at the same time, a pair of rail devices 50 is attached, and the mounting-related process is executed on flat board 48 by the conveyance of rail device 50.

Here, the correspondence relationships between the configuration elements in the present embodiment and the configuration elements in the present disclosure will be clarified. Mounting device 11 of the present embodiment corresponds to a mounting-related device, and rail device 50 corresponds to a rail device. In addition, board moving section 51 corresponds to a moving section, first conveyance section 21 corresponds to a first conveyance section, second conveyance section 22 corresponds to a second conveyance section, articulated robot 24 corresponds to an articulated robot, application head 32 and mounting head 37 correspond to processing heads, application section 30 and mounting section 35 correspond to XY-robots, and control section 15 corresponds to a control section. Further, rail attachment sections 21*a* and 22*a* correspond to rail attachment sections, supporting plate 45 and support pin 46 correspond to support members, general-purpose attachment section 27 corresponds to a support attachment section, three-dimensional board 44 and flat board 48 correspond to processing target objects, and movable space 29 corresponds to a movable space.

In mounting device 11 of the present embodiment described above, since three-dimensional board 44, which is processing target object, can be moved and fixed by articulated robot 24 while changing the posture of mounting surface, it is possible to execute a three-dimensional process. On the other hand, in mounting device 11, flat board 48, which is a plate-like member, can be conveyed by attaching rail device 50 between first conveyance section 21 and second conveyance section 22. Accordingly, in mounting device 11, it is possible to convey boards that are various processing target objects in a more suitable state. In addition, articulated robot 24 includes general-purpose attachment section 27 that can attach and detach supporting plate 45 serving as a support member that supports flat board 48 from below when rail device 50 is attached to rail attachment sections 21*a* and 22*a* and a process is performed on flat board 48. In mounting device 11, since flat board 48 can be supported from below using articulated robot 24, it is unnecessary to provide another supporting mechanism, so that complication of the configuration can be further suppressed.

In addition, rail device 50 includes driving section 58 that applies a conveyance force for conveying flat board 48, and control section 15 is electrically connected to driving section 58 to also control driving section 58 so as to convey flat board 48 on rail device 50. In mounting device 11, flat board 48 can be conveyed by driving section 58 disposed in rail device 50. Further, rail device 50 includes fixing section 52 that grips and fixes flat board 48, and control section 15 also controls fixing section 52 so as to fix flat board 48 on rail device 50. In mounting device 11, flat board 48 can be reliably fixed by fixing section 52. Furthermore, since rail device 50 includes board moving section 51 that supports and moves flat board 48, flat board 48, which is a plate-like member, can be conveyed by attaching rail device 50 between first conveyance section 21 and second conveyance section 22.

It is needless to say that the three-dimensional mounting device of the present disclosure is not limited in any way to the above-described embodiment, and any embodiment can be implemented in various modes as long as the embodiment belongs to the technical scope of the present disclosure.

For example, in the above-described embodiment, supporting plate 45 is attached on general-purpose attachment section 27 to support flat board 48, but this may be omitted. Even when supporting plate 45 is omitted, mounting device 11 can convey and fix flat board 48 by rail device 50.

In the above-described embodiment, mounting device 11 is configured to perform a printing process of applying the viscous liquid to the board or a mounting process of arranging component P on the board as a mounting-related device, but the configuration is not limited to this, any one of them may be omitted, or may perform other processes related to the mounting, such as, for example, an inspection process for inspecting the board and/or the member arranged on the board. Similarly, in the above-described embodiment, mounting device 11 includes application head 32 and mounting head 37, so that an application process and an arrangement process of component P with respect to three-dimensional board are performed, but any one of them may be omitted. In addition, another head may be included, such as an inspection head for inspecting the board and/or the member on the board.

Figure 9A:
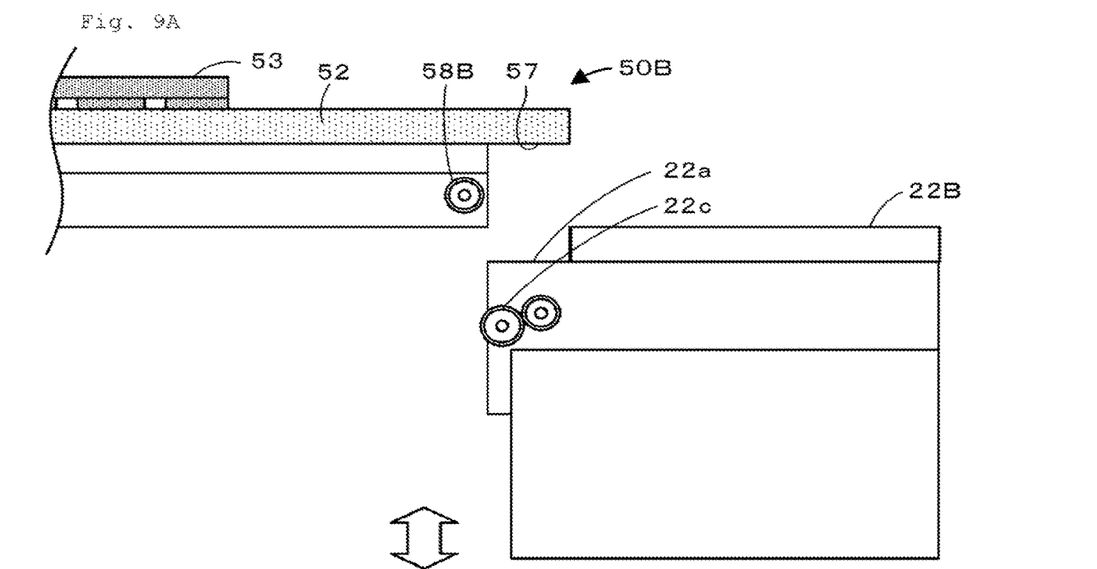
FIG. 9 is explanatory diagrams of another rail device 50B.
Figure 9B:
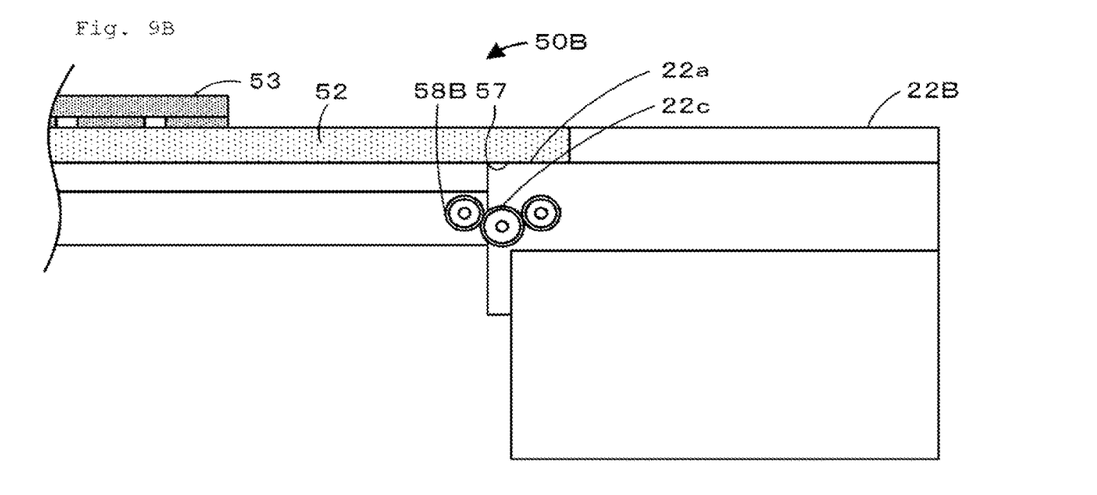

In the above-described embodiment, rail device 50 is configured to include driving section 58 to operate board moving section 51 by the drive force of driving section 58 and convey flat board 48, but the configuration is not particularly limited to this, and may operate board moving section 51 using the drive force of first conveyance section 21 and second conveyance section 22, for example, to convey flat board 48. FIG. 9 is explanatory diagrams of another rail device 50B, in which FIG. 9A is an explanatory diagram before attaching rail device 50B, and FIG. 9B is an explanatory diagram when attaching rail device 50B. Second conveyance section 22 is shown in FIG. 9, but first conveyance section 21 may also include a similar connecting section. Rail device 50B includes connecting section 58B, which is a gear connected to a rotary shaft of a roller for driving a belt of board moving section 51, and second conveyance section 22B includes connecting section 22c, which is a gear serving as a member related to conveyance. Connecting section 22c is connected to a roller shaft of the conveyor belt included in second conveyance section 22, and follows the driving of the conveyor belt. Connecting section 58B and connecting section 22c mesh when attaching rail device 50B (refer to FIG. 9B), and transmit the drive force of driving section (not shown) included in second conveyance section 22 to board moving section 51. The member related to the conveyance may be the conveyor belt or the like that conveys flat board 48 by first conveyance section 21 or second conveyance section 22 in addition to the gear. Also in this case, flat board 48 can be conveyed using the connecting section.

Figure 10A:
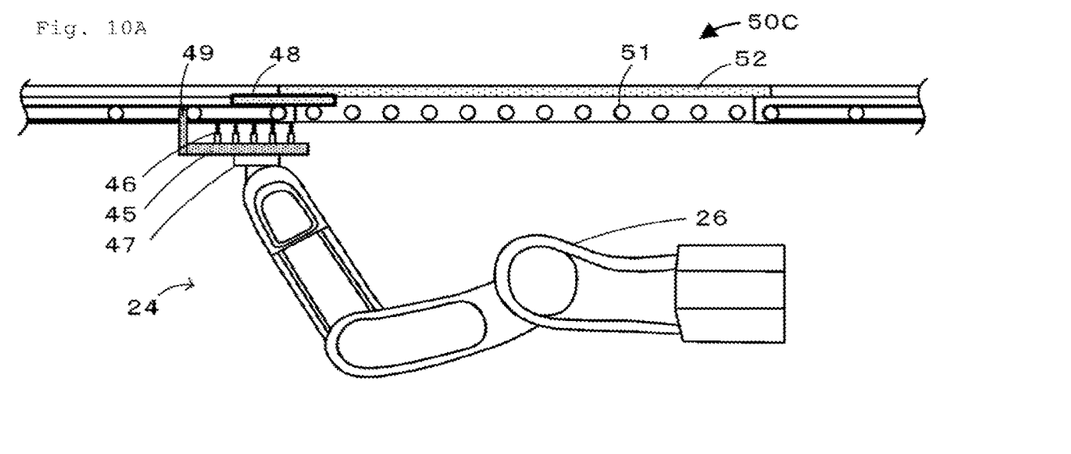
FIG. 10 is explanatory diagrams of another rail device 50C.
Figure 10B:
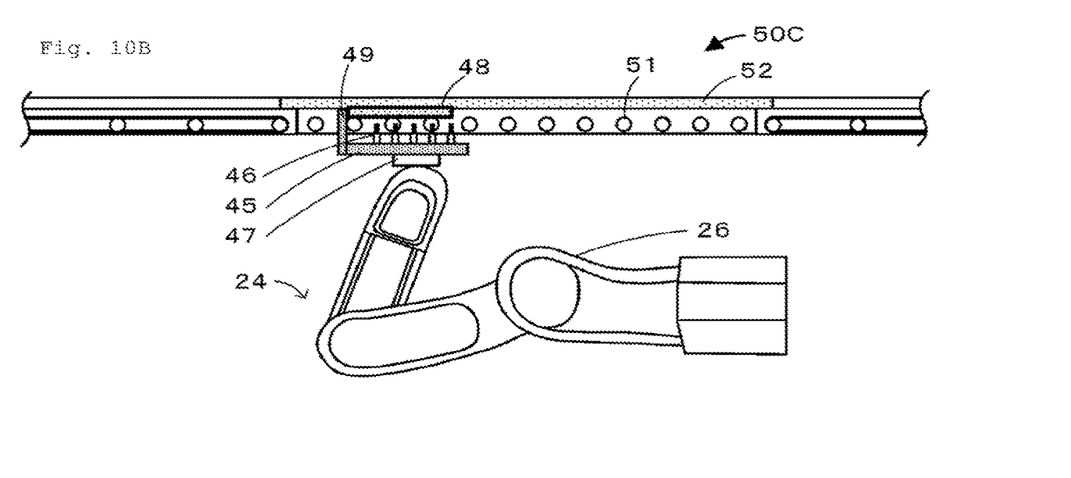
Figure 10C:
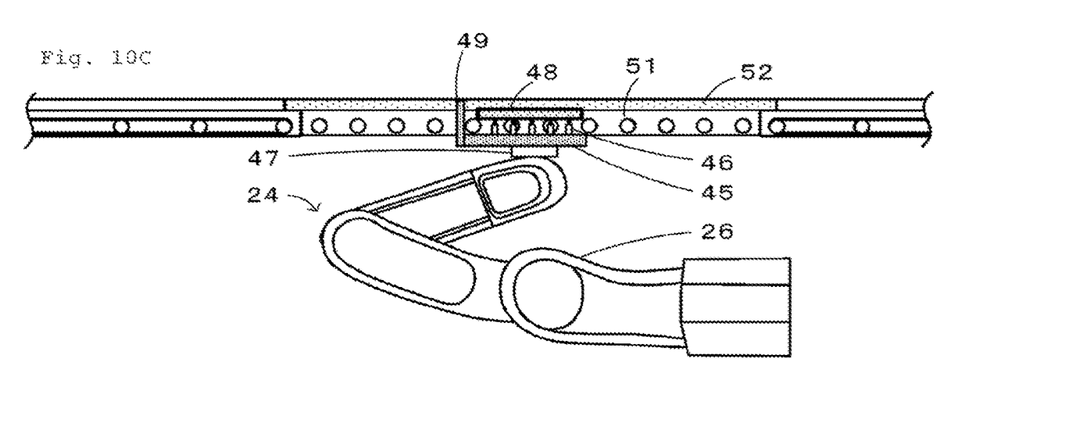

In the above-described embodiment, rail device 50 includes driving section 58, and board moving section 51 is operated by the drive force of driving section 58 to convey flat board 48, but the configuration is not particularly limited to this, and flat board 48 may be conveyed using articulated robot 24. FIG. 10 is explanatory diagrams of another rail device 50C, in which FIG. 10A is a diagram before abutting on contact member 49, FIG. 10B is a diagram of the movement of contact member 49, and FIG. 10C is a diagram of supporting flat board 48 from below. When rail device 50C is attached to rail attachment sections 21a and 22a to perform a process on flat board 48, supporting plate 45, on which contact member 49 that comes into contact with a part of flat board 48 is disposed, is attached and detached on general-purpose attachment section 27 of articulated robot 24. Contact member 49 is a rod-like member abutting on an end portion of flat board 48, and has a height higher than support pin 46. In addition, board moving section 51 of rail device 50C is multiple idle rollers, and a belt is omitted. In addition, in FIG. 10, fixing plate 53 is not shown such that the state of flat board 48 is easily visible. In rail device 50C, CPU 16 controls articulated robot 24 such that an upper end of contact member 49 contacts an end portion of flat board 48 (FIGS. 10A and 10B), and moves flat board 48 between the introduction position and the discharge position along rail device 50C by the operation of articulated robot 24. In rail device 50C, since flat board 48 can be conveyed along rail device 50C by the operation of articulated robot 24, it is unnecessary to newly add a complicated configuration for conveying flat board 48, so that complication of the configuration can be further suppressed.

In the above-described embodiment, fixing section 52 is configured to grip and fix flat board 48 in the up-down direction by fixing plate 53, but the configuration is not particularly limited to this, and fixing section 52 may grip and fix flat board 48 from the left-right direction. In addition, although fixing section 52 is configured to have fixing plate 53 that descends from the upper side and presses flat board 48, the configuration is not particularly limited to this, and, for example, fixing plate 53 may be omitted, the conveyor belt of board moving section 51 may be moved upward, and flat board 48 may be pressed against structure 56 to fix flat board 48.

In the above-described embodiment, articulated robot 24 is configured such that an axial direction of base section 25 is fixed in a direction along a movement direction (an X-axis direction) of the processing target object, but, for example, the axial direction of base section 25 is not limited to the X-axis direction, but the axial direction may be set in a direction along a horizontal direction, that is, articulated robot 24 may be simply fixed horizontally. Also in this device, space saving in the height direction can be achieved. Alternatively, in the above-described embodiment, the axial direction of base section 25 is configured to be along the horizontal direction, that is, articulated robot 24 is configured to be placed horizontally, but the configuration is not particularly limited to this, and articulated robot 24 may be fixed in the vertical direction. In addition, in the above-described embodiment, the perpendicular articulated robot is configured to be employed, but the configuration is not particularly limited to this, and other articulated robots may be employed. In addition, in the above-described embodiment, the articulated robot 24 configured to have six shafts as a movable shaft is included, but the configuration is not particularly limited to this, and the movable shaft is optional. When the movable shaft is 4 or more shafts, a degree of freedom of an operation range of articulated robot 24 is preferably higher. Further, in the above-described embodiment, articulated robot 24 has first to fifth arms 26a to 26e, but the number of movable members of arm section 26 may be appropriately selected according to a device size, a size of the processing target object, and the like.

In the above-described embodiment, rail device 50 is configured to have attachment section 57 and rail attachment sections 21a and 22a to be attached by fitting the unevenness, but the configuration is not particularly limited to this, and rail device 50 may be attached to first conveyance section 21 and second conveyance section 22 by electromagnets.

Figure 11:
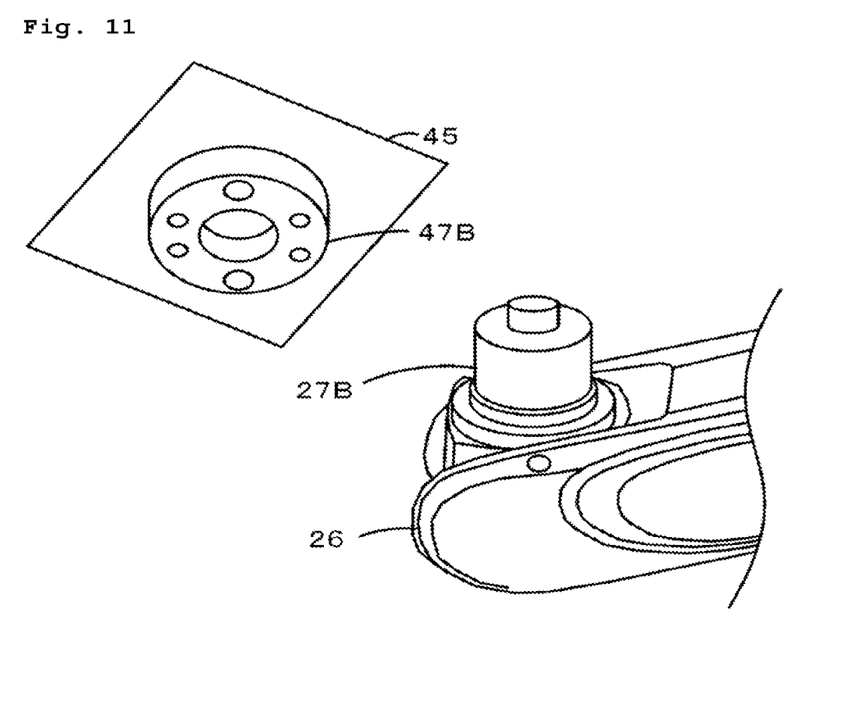
FIG. 11 is an explanatory diagram of another general-purpose attachment section 27B and plate-side attachment section 47B.

In the above-described embodiment, pallet-side attachment section 42 is configured to be a clamp plate, and general-purpose attachment section 27 is configured to be a mechanical chuck that grips and fixes the clamp plate, but the configuration is not particularly limited to this. FIG. 11 is an explanatory diagram of another general-purpose attachment section 27B and plate-side attachment section 47B. As shown in FIG. 11, it may be used as general-purpose attachment section 27B and plate-side attachment section 47B in which a protruding portion is inserted into a recessed portion and fixed. In FIG. 11, general-purpose attachment section 27B is configured to have the protruding portion, and plate-side attachment section 47B is configured to have the recessed portion, but the configuration may be reversed. Further, general-purpose attachment section 27B, plate-side attachment section 47B, and pallet-side attachment section 42 may be fixed, for example, by picking up under negative pressure, or may be fixed by magnetic force.

Here, the mounting-related device and the rail device of the present disclosure may be configured as follows. For example, in the mounting-related device of the present disclosure, the articulated robot may be configured to include a support attachment section that can attach and detach a support member for supporting the board from below when the rail device is attached on the rail attachment section and a process is performed on the board. In the mounting-related device, since the board can be supported from below using the articulated robot, it is unnecessary to provide another supporting mechanism, so that complication of the configuration can be further suppressed. In the mounting-related device, the control section may be configured to control the first conveyance section, the second conveyance section, and the articulated robot such that the board is conveyed and fixed onto the rail device and the board is supported on the articulated robot from below by the support member when the rail device is attached on the rail attachment section and the support member is attached on the articulated robot.

In the mounting-related device according to the present disclosure, the rail device may be configured to include a connecting section that obtains a conveyance force of the board by physically contacting at least one of a conveyance member of the first conveyance section and/or a conveyance member of the second conveyance section, and the control section may be configured to drive and control the first conveyance section and/or the second conveyance section to convey the board on the rail device. In the mounting-related device, since the board can be conveyed via the connecting section by driving first conveyance section and/or second conveyance section, it is unnecessary to provide another driving section, so that complication of the configuration can be further suppressed. Here, the connecting section may be configured to be, for example, a gear, or may be configured to be a conveyor belt to which conveyance force is applied by abutting.

In the mounting-related device according to the present disclosure, the rail device includes a driving section that applies a conveyance force for conveying the board, and the control section may be configured to be electrically connected to the driving section and also control the driving section so as to convey the board on the rail device. In the mounting-related device, the board can be conveyed by the driving section disposed in the rail device.

In the mounting-related device according to the present disclosure, the rail device includes a fixing section that grips and fixes the board, and the control section may be also configured to control the fixing section so as to fix the board on the rail device. In the mounting-related device, the board can be reliably fixed by the fixing section. Here, the fixing section may grip the board in the up-down direction or may grip the board from the left-right direction.

In the mounting-related device according to the present disclosure, the articulated robot includes a contact member attachment section that can attach and detach a contact member that comes into contact with a part of the board when the rail device is attached on the rail attachment section and a process is performed on the board, and the control section may be configured to bring the board into contact with the contact member and move the board between the introduction position and the discharge position along the rail device by an operation of the articulated robot. In the mounting-related device, since the board can be conveyed along the rail device by the operation of the articulated robot, it is unnecessary to newly add a complicated configuration for conveying the board, so that complication of the configuration can be further suppressed.

The mounting-related device according to the present disclosure is the mounting-related device including a pair of rail devices configured to be attached on the rail attachment section and bridged between the first conveyance section and the second conveyance section to move the board when conveying the board as the processing target object. In the mounting-related device, the board can be conveyed and fixed using a rail device. In the mounting-related device according to the present disclosure, the articulated robot may have one or more of the features (1) to (3). (1) The articulated robot is a perpendicular articulated robot, and an axial direction of the base section thereof is fixed in a direction along a horizontal direction. (2) The articulated robot is fixed in a direction in which the axial direction of the base section is along a movement direction of the processing target object. (3) The articulated robot has a movable shaft of four shafts or more.

The rail device according to the present disclosure is a rail device that is used in a mounting-related device including an XY-robot including a processing head for performing a predetermined process on a processing target object having a mounting surface and a moving section for moving the processing head in a predetermined plane direction, a first conveyance section configured to convey the processing target object into an introduction position, a second conveyance section configured to convey the processing target object out of a discharge position, an articulated robot disposed below a moving region of the processing head and in a movable space formed between the first conveyance section and the second conveyance section, and configured to hold the processing target object such that a posture of the mounting surface can be changed, and move the processing target object between the introduction position and the discharge position, and a control section configured to control the XY-robot and the articulated robot, the rail device being bridged between the first conveyance section and the second conveyance section, and attached on a rail attachment section provided in the first conveyance section and the second conveyance section when the first conveyance section and the second conveyance section convey the board which can be conveyed, the rail device including a moving section configured to support and move the board, and a fixing section configured to grip and fix the board.

The rail device can convey the board, which is a plate-like member, by attaching the rail device between first conveyance section and second conveyance section of the mounting-related device described above. Accordingly, in the rail device, various processing target objects can be conveyed in a more suitable state. Here, the moving section may be a conveyor belt that supports and moves the board. In addition, the fixing section may grip the board in the up-down direction or may grip the board from the left-right direction. In the rail device, various aspects of the mounting-related device described above may be employed, or steps for realizing each function of the mounting-related device described above may be added.

INDUSTRIAL APPLICABILITY

The mounting-related device and the rail device according to the present disclosure can be used in the technical field of a device for performing s predetermined process related to mounting on a three-dimensional object or a flat plate-like processing target object.

REFERENCE SIGNS LIST

10: Mounting system, 11: Mounting device, 12: Component supply section, 13: Parts camera, 15: Control section, 16: CPU, 17: Storage section, 20: Support conveyance section, 21: First conveyance section, 21a: Rail attachment section, 22: Second conveyance section, 22a: Rail attachment section, 22b: Socket, 22c: Connecting section, 24: Articulated robot, 25: Base section, 26: Arm section, 26a: First Arm, 26b: Second Arm, 26c: Third Arm, 26d: Fourth Arm, 26e: Fifth Arm, 27, 27B: General-purpose attachment section, 28: Driving section, 29: Movable space, 30: Application section, 31: Head moving section, 32: Application head, 33: Application nozzle, 35: Mounting section, 36: Head moving section, 37: Mounting head, 38: Pickup section, 40: Conveyance pallet, 41: Arrangement section, 42: Pallet-side attachment section, 44: Three-dimensional board, 45: Supporting plate, 46: Support pin, 47, 47B: Plate-side attachment section, 48: Flat board, 49: Contact member, 50, 50B, 50C: Rail device, 51: Board moving section, 52: Fixing section, 53: Fixing plate, 54, 55: Air supply section, 57: Attachment section, 58: Driving section, 58B: Connecting section, 59: Plug, 60: Management PC, P: Component

The invention claimed is:

1. A mounting-related device that performs a predetermined process on a processing target object by using an XY-robot including a processing head for performing a predetermined process on the processing target object having a mounting surface and a moving section for moving the processing head in a predetermined plane direction, the mounting-related device comprising:
a first conveyance section configured to convey the processing target object into an introduction position;
a second conveyance section configured to convey the processing target object out of a discharge position;
an articulated robot disposed below a moving region of the processing head and in a movable space formed between the first conveyance section and the second conveyance section, and configured to hold the processing target object such that a posture of the mounting surface can be changed, and move the processing target object between the introduction position and the discharge position, the articulated robot having multiple axes so as to be configured to tilt the processing target object in multiple directions; and
a control section configured to control the XY-robot and the articulated robot, wherein
the first conveyance section and the second conveyance section include a rail attachment section that can attach and detach a pair of rail devices which are bridged between the first conveyance section and the second conveyance section and move a board as the processing target object which can be conveyed by the first conveyance section and the second conveyance section when the board is conveyed, and
the articulated robot includes a base section fixed to a device housing, an arm section supported by the base section, the arm section being rotatable relative to the base section, and an attachment section that can attach and detach the processing target object, and attach and detach a support member for supporting the board from below when the rail device is attached on the rail attachment section and a process is performed on the board.

2. The mounting-related device according to claim 1, wherein
the control section controls the first conveyance section, the second conveyance section, and the articulated robot such that the board is conveyed and fixed onto the rail device and the board is supported on the articulated robot from below by the support member when the rail device is attached on the rail attachment section and the support member is attached on the articulated robot.

3. The mounting-related device according to claim 1, wherein
the rail device includes a connecting section that obtains a conveyance force of the board by physically contacting at least one of a conveyance member of the first conveyance section and a conveyance member of the second conveyance section, and
the control section drives and controls at least one of the first conveyance section and the second conveyance section to convey the board on the rail device.

4. The mounting-related device according to claim 1, wherein
the rail device includes a driving section that applies a conveyance force for conveying the board, and
the control section is electrically connected to the driving section and also controls the driving section so as to convey the board on the rail device.

5. The mounting-related device according to claim 1, wherein
the rail device includes a fixing section that grips and fixes the board, and
the control section also controls the fixing section so as to fix the board on the rail device.

6. The mounting-related device according to claim 1, wherein
the attachment section can attach and detach a contact member that comes into contact with a part of the board when the rail device is attached on the rail attachment section and a process is performed on the board, and
the control section brings the board into contact with the contact member and moves the board between the introduction position and the discharge position along the rail device by an operation of the articulated robot.

7. The mounting-related device according to claim 1, further comprising:
a pair of rail devices configured to be attached on the rail attachment section and bridged between the first conveyance section and the second conveyance section to move the board when conveying the board as the processing target object.

8. A rail device that is used in a mounting-related device including
an XY-robot including a processing head for performing a predetermined process on a processing target object having a mounting surface and a moving section for moving the processing head in a predetermined plane direction,
a first conveyance section configured to convey the processing target object into an introduction position,
a second conveyance section configured to convey the processing target object out of a discharge position,
an articulated robot disposed below a moving region of the processing head and in a movable space formed between the first conveyance section and the second conveyance section, and configured to hold the processing target object such that a posture of the mounting surface can be changed, and move the processing target object between the introduction position and the discharge position, and a control section configured to control the XY-robot and the articulated robot, the rail device being bridged between the first conveyance section and the second conveyance section, and attached on a rail attachment section provided in the first conveyance section and the second conveyance section when the first conveyance section and the second conveyance section convey the board which can be conveyed, the rail device comprising:

a moving section configured to support and move the board, the moving section including a plurality of rollers and a belt bridged over the plurality of rollers; and a fixing section configured to grip and fix the board, the fixing section including a fixing plate, first and second air supply sections, and a structure bridging the first conveyance section and the second conveyance section, the fixing plate being movable up and down in the structure based on air supplied by the first air supply section or the second air supply section, wherein the structure includes attachment sections formed on both ends of the structure, the attachment sections presenting a shape configured to be fitted into unevenness of the rail attachment sections of the first and second conveyance sections.

* * * * *